(12) United States Patent
Mitbander et al.

(10) Patent No.: US 7,444,558 B2
(45) Date of Patent: Oct. 28, 2008

(54) PROGRAMMABLE MEASUREMENT MODE FOR A SERIAL POINT TO POINT LINK

(75) Inventors: Suneel G. Mitbander, Phoenix, AZ (US); Cass A. Blodgett, Phoenix, AZ (US); Andrew W. Martwick, Folsom, CA (US); Lyonel Renaud, Gilbert, AZ (US); Theodore Z. Schoenborn, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 1021 days.

(21) Appl. No.: 10/750,034

(22) Filed: Dec. 31, 2003

(65) Prior Publication Data

US 2005/0154946 A1    Jul. 14, 2005

(51) Int. Cl.
*G01R 31/28* (2006.01)

(52) U.S. Cl. .................. 714/716; 714/715; 714/25; 714/30; 714/32; 714/36; 714/43; 714/44; 714/48; 714/728; 714/712; 714/713; 714/717; 714/724; 714/733; 714/734; 714/736; 714/739; 714/738; 702/108; 375/221; 375/224

(58) Field of Classification Search ............. None
See application file for complete search history.

(56) References Cited

U.S. PATENT DOCUMENTS

| | | | |
|---|---|---|---|
| 5,228,042 A * | 7/1993 | Gauthier et al. | 714/716 |
| 5,956,370 A * | 9/1999 | Ducaroir et al. | 375/221 |
| 5,970,073 A * | 10/1999 | Masuda et al. | 714/738 |
| 6,009,488 A | 12/1999 | Kavipurapu | |
| 6,128,750 A * | 10/2000 | Espy et al. | 714/7 |
| 6,690,488 B1 * | 2/2004 | Reuman | 358/1.9 |
| 6,977,960 B2 * | 12/2005 | Takinosawa | 375/224 |
| 7,127,648 B2 * | 10/2006 | Jiang et al. | 714/715 |
| 7,191,371 B2 * | 3/2007 | Hsu et al. | 714/717 |
| 7,257,725 B2 * | 8/2007 | Osaka et al. | 713/500 |
| 2004/0117707 A1 * | 6/2004 | Ellis et al. | 714/733 |
| 2004/0117708 A1 * | 6/2004 | Ellis et al. | 714/733 |
| 2004/0136319 A1 * | 7/2004 | Becker et al. | 370/225 |

(Continued)

OTHER PUBLICATIONS

PCI_SIG, "PCI Express Base Specification Revision 1.0", Apr. 2002, pp. 31,32,45,150-152,158-160, 164-169,181,182,197,222,231,241-243,378.*

(Continued)

*Primary Examiner*—John P Trimmings
(74) *Attorney, Agent, or Firm*—Blakely, Sokoloff, Taylor & Zafman LLP

(57) ABSTRACT

A serial point to point link that communicatively couples an integrated circuit (IC) device to another IC device is initialized by transferring a training sequence of symbols over the link. Registers of the IC device are programmed, to set a symbol data pattern and configure a lane transmitter for the link. A start bit in a register of the IC device is programmed, to request that the link be placed in a measurement mode. In this mode, the IC device instructs the other IC device to enter a loopback mode for the link. The IC device transmits a sequence of test symbols over the link and evaluates a loopback version of the sequence for errors. The sequence of test symbols have a data pattern, and are transmitted, as configured by the registers. Other embodiments are also described and claimed.

23 Claims, 11 Drawing Sheets

U.S. PATENT DOCUMENTS

2004/0158675 A1* 8/2004 Hirose .................. 711/115
2004/0186688 A1* 9/2004 Nejedlo ................. 702/186
2004/0193986 A1* 9/2004 Canagasaby et al. ........ 714/738
2004/0204912 A1* 10/2004 Nejedlo et al. ............ 702/188
2004/0221056 A1* 11/2004 Kobayashi ............... 709/232

OTHER PUBLICATIONS

Ravi Budruk, et al. "PCI Express System Architecture", PC System Architecture Series, MindShare, Inc., Sep. 2003 (Contents, pp. vii-xxxvii; and Chapter 14—Link Initialization & Training , pp. 499-553).

PCT International Search Report (dated May 9, 2005), International Application No. PCT/US2004/043427—International Filing Date Dec. 23, 2004 (11 pgs.).

Jay J. Nejedlo, "IBIST™ (Interconnect Built-in-Self-Test) Architecture and Methodology for PCI Express", Institute of Electrical and Electronics Engineers, Proceedings International Test Conference 2003, Charlotte, NC, USA Sep. 30-Oct. 2, 2003 (IEEE, US vol. 2, Sep. 30, 2003) XP010685400, ISBN:0-7803-8106-8 (pp. 114-122).

Jay J. Nejedlo, "Tribute™ Board and Platform Test Methodology", Institute of Electrical and Electronics Engineers, Proceedings International Test Conference 2003, Charlotte, NC, USA Sep. 30-Oct. 2, 2003 (IEEE, US vol. 2, Sep. 30, 2003) XP010685399, ISBN: 0-7803-8106-8 (pp. 106-113).

* cited by examiner

FIG. 4B

| Register | D0 | D1 | D2 | D3 | D0 | D1 |
|---|---|---|---|---|---|---|
| Symbol | K28.5 | D21.5 | K28.5 | D10.2 | K28.5 | D21.5 |
| Disparity | 0 | 1 | 1 | 0 | 0 | 1 |
| Pattern | 0011111010 | 1010101010 | 1100000101 | 0101010101 | 0011111010 | 1010101010 |

FIG. 4C

| Register | D0 | D1 | D2 | D3 | D0 |
|---|---|---|---|---|---|
| Symbol | K28.5 | D21.5 | K28.5 | D10.2 | K28.5 |
| Disparity | 0 | 1 | 1 | 0 | 1 |
| Pattern | 0011111010 | 1010101010 | 1100000101 | 0101010101 | 1100000101 |

| Register | D0 | D0 |
|---|---|---|
| Symbol | K28.5 | K28.5 |
| Disparity | 0 | 1 |
| Pattern | 0011111010 | 1100000101 |

PROGRAMMABLE MEASUREMENT MODE FOR A SERIAL POINT TO POINT LINK

BACKGROUND

An embodiment of the invention is generally related to serial, point to point interconnect technology suitable for communicatively coupling elements of an electronic system, and particularly to those which have certain aspects that are in accordance with the PCI Express Base Specification 1.0a (Errata dated 7 Oct. 2003) ("PCI Express"). Other embodiments are also described.

An electronic system is composed of several elements that are designed to communicate with one another over an input/output (I/O) interconnect of the system. For instance, a modern computer system may include the following elements: a processor, main memory, and a system interface (also referred to as a system chipset). An element may include one or more integrated circuit (IC) devices. For example, the system chipset may have a memory controller hub (MCH) device that allows the processor to communicate with system memory and a graphics element. In addition, an I/O controller hub (ICH) device may be provided that connects the processor and memory, via the MCH, to other elements of the computer system such as mass storage devices and peripheral devices. In that case, a separate, point to point link such as one defined by PCI Express may be used to allow bi-directional communication between a pair of devices, e.g. the processor and the MCH, the MCH and the graphics element, and the ICH and the mass storage device.

A PCI Express point to point link may have one or more lanes that can operate simultaneously. Each lane has dual, unidirectional paths, which are also simultaneously operable. Each path may have a single set of transmitter and receiver pairs (e.g., a transmitter in a port of Device A, a receiver in a port of Device B). In that case, the transmitter and receiver may drive and sense a transmission medium such as a pair of metal traces in a printed wiring board that may traverse a board-to-board connector. Alternatively, other transmission media may be provided, such as optical fiber.

A point to point link serves to transport various types of information between devices. At a so-called "higher layer", however, communications between peers in two devices (also referred to as a requester and a completer) may be conducted using transactions. For example, there are memory transactions that transfer data to or from a memory-mapped location. Under PCI Express, there are also message transactions that communicate miscellaneous messages and can be used for functions like interrupt signaling, error signaling, and power management.

There may be three abstract layers that "build" a transaction. The first layer may be the Transaction Layer, which begins the process of turning a request or completion data coming from a device core into a data packet for a transaction. The second architectural build layer is called the Data Link Layer; it ensures that packets going back and forth across a link are received properly (via techniques such as error control coding). The third layer is called the Physical Layer. This layer is responsible for the actual transmitting and receiving of the packet across the link. The Physical Layer in a given device interacts with its Data Link Layer (in the same device) on one side, and with the metal traces, optical fiber, or other transmission medium that is part of the link, on another side. The Physical Layer may contain circuitry for the transmitters and receivers, parallel to serial and serial to parallel converters, frequency and phase control circuits, and impedance matching circuitry. It may also contain circuitry for logic functions needed for its initialization and maintenance. A layered architecture may permit easier upgrades by, for example, allowing reuse of essentially the same Transaction and Data Link Layers, while upgrading the Physical Layer (e.g., increasing transmit and receive clock frequencies).

An example of the behavior of the Physical Layer is now given. Once power up occurs, the Physical Layers on both Device A and Device B are responsible for initializing the link and making it ready for transactions. This initialization process may include determining how many lanes should be used for the link, and at what data rate the link should operate. Sometime after the link is properly initialized, a memory read request is initiated in Device A. Eventually, a packet that includes this read request arrives at Device A's Physical Layer, including headers, error control information, and sequence numbers added by the higher layers. The Physical Layer then takes this packet of data and transforms it into a serial data stream (perhaps after adding framing data to it), and transmits the stream using, for example, an electrical, differential signal having predefined timing rules.

Once the Physical Layer in Device B sees the signal appear at its receiver input, it samples the signal to recover the data stream, and builds the stream back into a data packet (e.g., after removing the framing). The packet is then passed up to the Data Link Layer in Device B, which strips the headers and checks for errors; if there are no errors, the packet is passed up to the Transaction Layer where the memory read request is extracted and then sent to the appropriate logic function to access the locations specified in the request.

BRIEF DESCRIPTION OF THE DRAWINGS

The embodiments of the invention are illustrated by way of example and not by way of limitation in the figures of the accompanying drawings in which like references indicate similar elements. It should be noted that references to "an" embodiment of the invention in this disclosure are not necessarily to the same embodiment, and they mean at least one.

FIG. 4B shows an example running compliance pattern that is transmitted over a lane of the link in the measurement mode.

FIG. 4C illustrates a corresponding inverted pattern that is transmitted over a different lane of the link.

DETAILED DESCRIPTION

Figure 1:
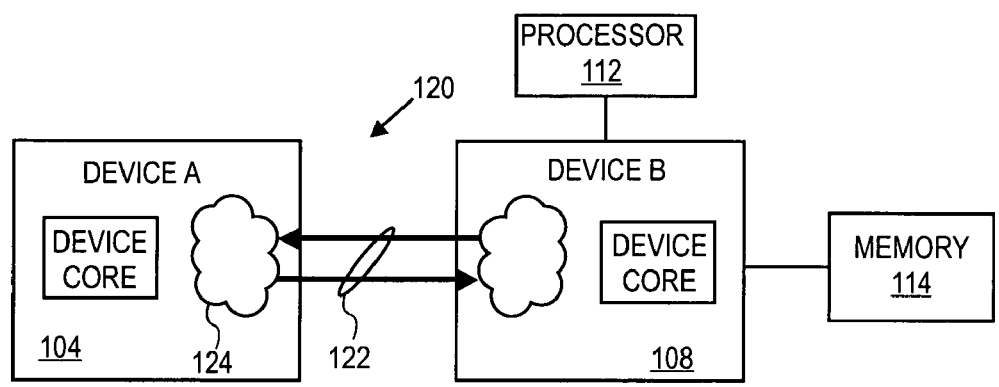
FIG. 1 illustrates a pair of integrated circuit devices that are coupled to each other via a serial point to point link.

Various embodiments of a method and apparatus that are suitable for characterizing and ensuring the correct functionality of the transmitter and receiver sections on both sides of a serial point to point link are described. A new mode of operation, referred to as the "compliance measurement/margining" mode (CMM mode, or measurement mode) is defined for the link. FIG. 1 illustrates a pair of integrated circuit devices that are coupled to each other via a serial point to point link. The IC devices 104 (Device A) and 108 (Device B) may be part of a computer system that contains a processor 112 and main memory 114. In this example, a serial point to point link 120 is used to communicatively couple the core of Device B with that of Device A. The link 120 has dual, unidirectional paths 122, with link interface 124 that serves to interface with the device core of each respective Device A and B.

In this embodiment, Device B is referred to as the root complex of the computer system and provides the processor 112 with I/O access to, for instance, a graphics element in Device A. The root complex may be partitioned into a graphics and memory controller hub (GMCH) and an I/O controller hub (ICH). The ICH would act as a further interface between the GMCH and other I/O devices of the system, including a non-volatile mass storage device, a pointing device such as a track pad or mouse, and a network interface controller (not shown). The point to point link 120 may be duplicated for communicatively coupling the Device B to the processor 112 and the main memory 114. Other platform architectures that feature the point to point link 120 are also possible.

Figure 2:
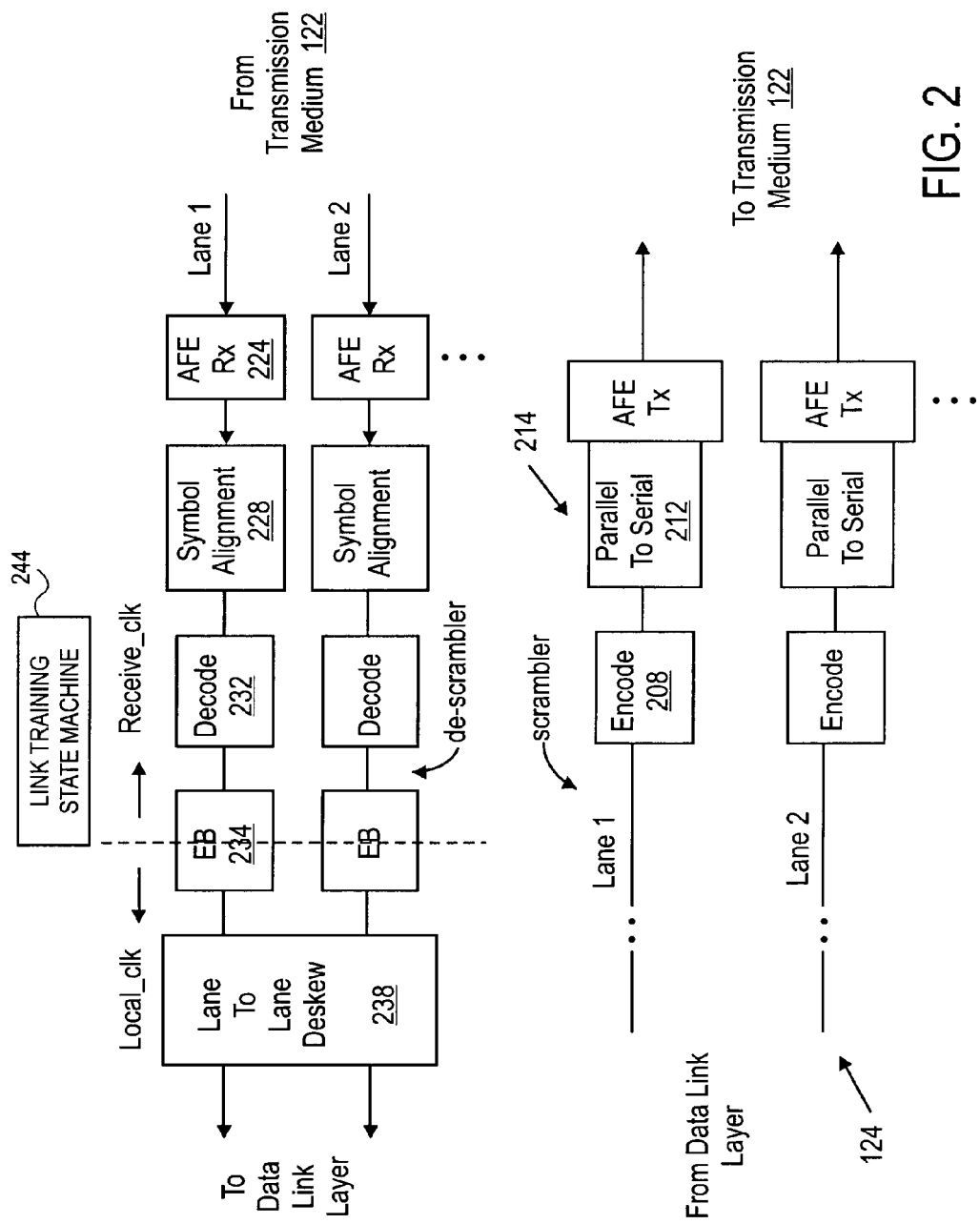
FIG. 2 shows a block diagram of part of the link interface circuitry used to implement the serial point to point link in an integrated circuit device.

The interface 124 of FIG. 1 may be viewed as implementing the multiple layer architecture (described above in the Background) for a serial point to point link. Some details of the interface 124 are illustrated in FIG. 2. The interface 124 supports independent transmit and receive paths between the transmission medium 122 and the Data Link Layer of its respective device 104, 108. In the transmit path, information in the form of data packets arrive from the Data Link Layer and are divided into symbols that are encoded by an encode block 208. A purpose of the encoding by block 208 is to embed a clock signal so that a separate clock signal need not be transmitted into the transmission medium 122. This encoding may be the well known 8B-10B where an eight bit quantity is converted into a 10 bit quantity; other encoding schemes are possible. In some cases, such as where a separate strobe or clock signal is transmitted in the medium 122, there may be no need for such encoding. In addition, the symbols prior to being encoded may be scrambled to eliminate repetitive patterns in the subsequent bit stream and thereby help reduce noise generation.

Following encoding in block 208, the units of data (referred to here as symbols) are processed by a parallel to serial block 212 of an analog front end (AFE) transmit block 214 to yield a stream of bits. Note that a "bit" as used here may represent more than two different states, e.g. a binary bit, a ternary bit, etc. The term "bit" is used merely here for convenience and is not intended to be limited to a binary bit. The bit stream is then driven into the transmission medium 122. As explained above in the Background, this transmission medium may be a pair of metal traces formed in a printed wiring board. Other forms of the transmission medium 122 may alternatively be used, such as an optical fiber.

The series of blocks 208-214 may serve a single lane of the point to point link 120 (FIG. 1). In general, there may be more than one lane in the point to point link 120, so that a packet received from the Data Link Layer may be "striped" across multiple lanes for transmission.

Turning now to the receive side of the interface 124 shown in FIG. 2, each lane has its associated AFE receive block 224, which serves to receive a stream of information from the transmission medium 122, by for example sampling a signal in the transmission medium 122. The AFE receive block 224 translates between signaling of the transmission medium 122 and signaling of the IC device 104 (e.g., on-chip, complementary metal oxide semiconductor, CMOS, logic signaling). As will be explained below, the stream of information represents sequences of M-bit symbols (where M is an integer greater than 1) that have been transmitted by the Device B over the serial point to point link 120 (see FIG. 1).

The stream of bits provided by the AFE receive block 224 is fed to symbol alignment logic 228 which serves to align or lock onto the symbols that have been received. In other words, and as will be explained below, the symbol alignment logic 228 will demarcate the correct symbol boundaries within the received bit stream, for use by subsequent sections of the Physical Layer in the device 104.

The symbol-aligned bit stream may then be fed to decode block 232 which undoes the encoding performed by encode block 208 (e.g., 10B-8B decoding, to yield symbols of information consisting of eight binary bits each). In addition, any de-scrambling (if applicable) would then be performed on the decoded symbols.

The decoded symbols are then fed to an elastic buffer, EB 234. The EB 234 serves to compensate for any differences in the tolerance of the rate at which the symbols were transmitted in Device B and a local clock signal (local_clk) of Device A. The local_clk is used to unload symbols from the EB 234, as well as in some cases operate parts of lane to lane deskew circuitry 238 as explained below (in the case where the link 120 is composed of more than one lane). It should be noted that the decode block 232 (if provided) may be placed further downstream, e.g. at the output of the EB 234 or at the output of the deskew circuitry 238.

A symbol may be a "data" symbol that represents some payload that has been sourced by the Data Link Layer, Transaction Layer or some other higher layer such as the device core. Alternatively, a symbol may be a "non-data" symbol, e.g. a special symbol generated by one of the Physical, Data Link, or Transaction Layers, to achieve some type of control over the information that is being transmitted over the serial point to point link. Several examples of such non-data symbols will be given below as PCI Express special symbols.

PCI Express defines a number of special symbols that are added to the packets that are being communicated. For instance, special symbols may be added to mark the start and stop of a packet. This is done to let the receiving device know where one packet starts and where it ends. Different special symbols are added for packets that originate in the Transaction Layer than in the Data Link Layer. In addition, there is a special symbol called "SKP" (skip) which is to be used by the Physical Layer for compensating for small differences in the operating data rates of two communicating ports. There is also a special symbol called "COM" (comma) that is to be used for lane and link initialization by the Physical Layer.

Figure 10:
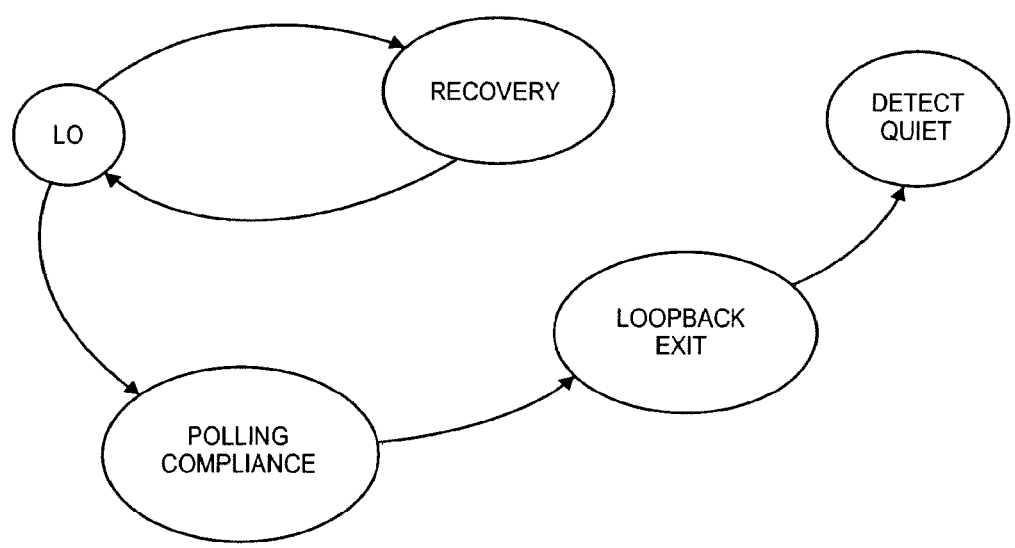
FIG. 10 is a state diagram showing transition between different states of a Link Training State Machine (LTSM).

FIG. 2 also shows a link training state machine (LTSM) 244. The LTSM 244 is a Physical Layer sub-block that is responsible for the link initialization process that configures and trains the constituent parts of a link so that normal packet traffic (from and to the Data Link Layer) can proceed through the link. Under PCI Express, the LTSM 244 is defined with a number of top-level states with each consisting of sub-states. There are link training states (Detect, Polling, and Configuration), link retraining (Recovery), power management states (L0, L1, L2/3), active power management states (L0s, L1), and other states (Hot Reset, External Loopback, and Disabled). See FIG. 10. The LTSM 244 enters and exits a state, for example, depending on whether certain conditions in the link interface 124 are met. The LTSM 244 also controls the link interface 124 to perform certain operations that have been defined for each state.

Figure 3:
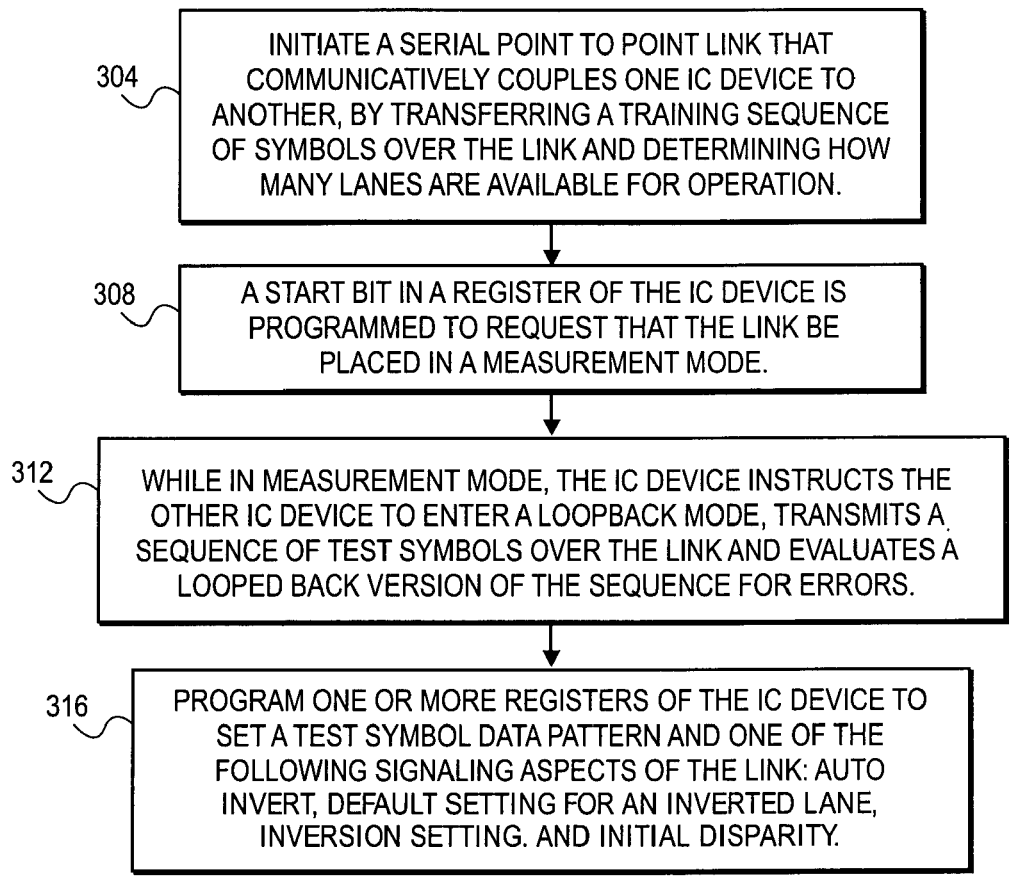
FIG. 3 depicts a flow diagram of a method for characterizing and ensuring the correct functionality of an analog front end to a serial point to point link.

Turning now to FIG. 3, FIG. 3 depicts a flow diagram of a method for characterizing and ensuring the correct functionality of an analog front end of a serial point to point link. The method may be performed in a system or platform that has an IC device (such as Device A, see FIG. 1) with a link interface as described above and that has been enhanced with measurement circuitry (details of which will be described below). The system also has a host (e.g., the processor 112 in FIG. 1, or another device such as a platform management unit, not shown) that may program Device A as described below. The method begins with initializing the serial point to point link which couples Device A to another IC device, such as Device B (block 304). This initialization may occur after a power on reset has been applied to Device A and Device B. The initialization may involve transferring a training sequence of symbols over the link, as well as determining how many lanes are available for operation in the link. For a PCI Express embodiment, the initializing may follow a fundamental reset, or it may follow a hot reset. Following a hot reset, the LTSM 244 (FIG. 2) may enter the Detect state, to start a link training process. This initialization process may be automatically started without any software involvement, after reset.

The following may be configured during the link initialization process: link width (including determining the number of lanes), lane reversal (for a multi-lane port that has differential signaling), polarity inversion (which may be needed if the differential pair terminals for the two IC devices are not connected correctly or have been intentionally reversed), link data rate, bit lock, symbol lock, and lane to lane deskew. The training sequences used during initialization may, as provided under PCI Express, be the physical layer packets referred to as Ordered-Sets.

To place the link in measurement mode (CMM mode), a start bit in a register of Device A, is programmed (block 308). This may be done after Device A has indicated that the link is ready for normal operation (including a determined number of lanes). Thus, one or more bits may be designated in a given register of Device A to be programmable (under host or software control, which may or may not be manually requested by a user of the system). The one or more start bits are to indicate to the measurement circuitry that the link is to now be placed in a measurement mode that is designed to characterize and ensure the correct functionality of the transmitters and receivers on one or both sides of the link. In addition, the measurement mode may also be designed with the ability to determine a margin of operation of the AFE transmit and receive blocks (see FIG. 2).

In the CMM mode, the Device A may instruct Device B (see FIG. 1) to enter a loopback mode for the link. In this mode, the Device B loops the symbols that have been received back over the same link. While Device A transmits a sequence of test symbols over the link, it may then evaluate a looped back version of the sequence for errors (block 312).

According to an embodiment of the invention, the transmitted sequence of test symbols have a data pattern as configured by one or more software programmable registers of Device A. In addition, the link transmitter may also be configured with certain signaling formats. Accordingly, the process contemplates a further operation of programming these registers of Device A (i) to set a test symbol data pattern and (ii) one of the following example link settings: autoinvert, default for an inverted lane, inversion, and initial disparity. These signaling aspects may be as defined under PCI Express.

In the PCI Express embodiment, the CMM mode is in addition to the training state referred to under PCI Express as Polling•Compliance. See FIG. 10. In the Polling•Compliance state, the transmitters of an IC device repeat a data pattern that is referred to as a compliance pattern, but the receivers in the IC device are essentially ignored for all but the detection of a unanimous exit (of all lanes) from electrical idle. According to an embodiment of the invention, the CMM mode may be a proprietary extension of Polling•Compliance. Note that in CMM mode, the receive path is active such that comparisons are performed on the symbols received in each lane, to evaluate the pattern of the symbols that have been received for any errors. This additional mode allows the IC device and in particular its link interface to be user configurable (or also referred to as "run-time programmable") to better characterize and ensure the correct functionality of the link interface.

To implement CMM mode, a comparator may be provided on each lane of the link. The comparator evaluates whether the pattern of symbols that have been received over a given lane match those that have been transmitted on that same lane. For this to be possible another IC device (such as Device B), which can be trained up to the PCI Express Loopback.Active state, for example, may be attached to the link. The device initiating CMM may be referred to as a loopback master or a CMM master, and the other device is a loopback slave or CMM slave. The following paragraphs describe some aspects of operation in CMM mode.

CMM Start

CMM mode may be initiated from the PCI Express L0 state of the CMM master, by writing a 1 to the CMM Start bit of a software-programmable register in the CMM master. In response, the following may take place:

The CMM master sends a training sequence such as a special loopback bit being set in a control byte of a TS1 Ordered-Set. This action trains the CMM slave into the PCI Express Loopback.Active. In addition, a SKP Ordered Set may then be transmitted on each lane of the link, followed by the transmission of a compliance pattern that may be repeated on each lane. When the SKP Ordered Set has looped back to a lane's receiver in the CMM master, that lane is deemed synchronized with its transmitter, so that the link interface may begin comparing each received symbol to determine any errors.

If any lane detects a miscompare or error, a CMM Error Detected status bit (in a software-accessible register, for example) is set. Meanwhile, other CMM registers capture the failing lane number and failing data pattern.

According to an embodiment of the invention, the link training state machine (LTSM) 244 of the link interface 124 (FIGS. 1-2) in the CMM master is provided with an additional flag that, when set, qualifies the PCI Express Polling•Compliance state into CMM mode (which enables the additional behavior as described here). This allows the CMM master to remain compatible with the base PCI Express states.

CMM Fail Detect

When an error is detected, the error bits, error lane and error data logging registers may be locked out from further updates, although the transmitters continue to cycle through the compliance pattern. For example, only the first failure may be logged—if two or more lanes fail simultaneously, the higher numbered lane may be the one that is logged. The failing lane may be determined by software reading a CMM Failing Lane Number register. A failing data pattern may need several status registers, depending on its size.

If the failing lane does not match one of the lanes indicated in a CMM Invert register, or if inversion is disabled, then the failing pattern is placed in a data register indicated by a CMM Symbol Error Number register. Otherwise, the failing pattern may be assumed to be an inverted one, and is placed in the data register indicated by the CMM Symbol Error Number Invert register.

Another type of failure may occur when the CMM master is unable to successfully train into CMM mode. Software may detect such a condition by polling a Training Timeout status register. A flag in this register will be set after the timeout of whatever training state that failed. As an alternative, software may poll a Link Status register at least every 0.5 us, for example, after setting the CMM Start bit; if this status is ever observed to transition from Detect (0000) to any other state and back to Detect over a predefined period of time (e.g., 20 us in fast-training or 80 ms in normal training), then it may assume that CMM mode was never entered.

CMM Exit

CMM mode may be exited by writing a 0 to the CMM Start bit. The CMM master may then initiate an exit from loopback and then move to the PCI Express Detect state to do a full retrain back to L0 state. Normal operation may then resume from the L0 state. In contrast, the PCI Express Polling•Compliance mode is only exited if all of the lanes that detected the presence of a receiver (at the other end of the link) now have detected an exit from a PCI Express Electrical Idle condition.

CMM Configurability

Operation of the link in the CMM mode may be configured by programming a number of registers, to configure the transmitters of one or more lanes in the link. In one embodiment, all changes to the CMM configuration are done prior to writing the CMM Start bit, and may not changed while the Start bit remains set. The CMM capabilities include:

Changing the data pattern. By writing to the CMM Data registers and the CMM Data Select registers, different transmit symbol patterns may be generated. The CMM Data Select registers may also determine if the corresponding CMM Data register will be 8b/10b encoded, as a data character or as a special symbol.

Disabling autoinvert. If a 0 is written to the CMM Autoinvert bit, the lanes which see the inverted pattern will not sequence to the next lane, but rather will remain on lane 0 and 8 as per the default initial condition under PCI Express.

Changing the default inverted lanes. By setting the value of CMM Invert Lane Number, a different initial set of lanes can be set for inversion. When combined with disabling autoinvert, the inversion pattern may be observed to remain on the specified lanes.

Disabling inversion. If a 0 is written to CMM Invert, no lanes will be inverted regardless of what is contained in any of the other registers.

Changing the initial disparity. The CMM Initial Disparity register sets the disparity of the first transmitted symbol of a CMM pattern. The 8b/10b encoder in the transmit path may determine the disparity of the rest of the transmit symbols Additional advantages may be obtained by operation in CMM mode, with the following user-configurable settings:

Transmitter load strobe margining. To measure a margin of operation of a transmitter load strobe in the link, the CMM master may be placed into CMM mode with a default load strobe position. The load strobe position may then be changed, i.e. advanced or delayed, prior to re-entering CMM mode. Since the transmitter load strobe may not be synchronized into the destination clock domain (of the CMM slave), there may be a one symbol error injected, even on known good strobe settings. Accordingly, upon setting a load strobe, the CMM Error bit should be written to clear a possible first symbol glitch. Subsequent values of the CMM Error bit may be trusted. The load strobe may also be shmooed by writing a new load strobe value, clearing the CMM Error bit, and then testing the CMM Error bit, and repeating.

Receiver Common Mode Voltage (Vcm) margining. According to another embodiment of the invention, the AFE receive block (see FIG. 2) may be designed to have variable Vcm. Note that a new Vcm setting may require that a certain settling time be considered, which makes such an AFE adjustment similar to the load strobe case. In other words, after entering CMM mode, the CMM Error bit should initially be cleared before evaluating the CMM Error bit for the effect of the changed Vcm.

Data Recovery Circuit (DRC) margining. A margin of operation of the Data Recovery Circuit (DRC) in the AFE receive block may be determined as follows. First, initiate CMM. Then, write to an mcount offset register to change the position of data sampling. Since these registers are clock crossed into the appropriate domain in the DRC, mcount offset can be shmooed with successive register writes and CMM Error bit evaluations.

Jitter Margining (Jitterbug). The tolerance of the AFE to jitter may be measured as follows. First, initiate CMM. Then, write one or more configuration registers with a step size, wait state, etc. to select the desired jitter parameters. Then write the enable bit to start jitter injection. The enable bit may be the only synchronized input to jitterbug logic (not shown) and should be executed as a final solitary register write. Next, evaluate the CMM Error bit. To shmoo over numerous settings, set up a new set of jitter parameters, write the enable bit, clear the CMM Error bit and then evaluate the CMM Error bit.

Example Circuitry for Transmitter Data Generation

Figure 4A:
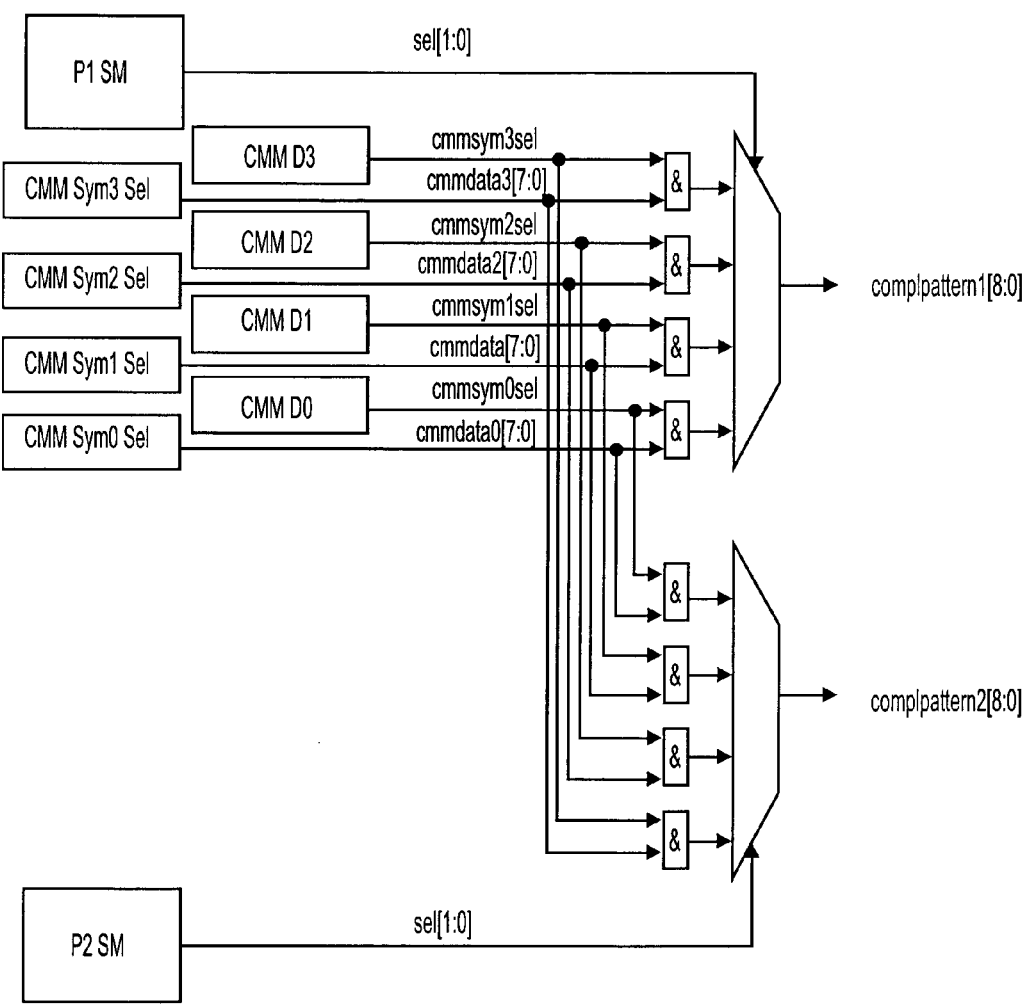
FIG. 4A depicts a block diagram of a technique for generating test symbol data to be transmitted over the serial point to point link in the measurement mode.

According to an embodiment of the invention, and as illustrated in FIG. 4A, two compliance pattern generating state machines P1 SM and P2 SM may be provided in the link interface 124 (see FIG. 1). These pattern generators may be started on two different conditions. In one case, the generators are started when the Link Training State Machine (LTSM) 244 (FIG. 2) enters the PCI Express Polling•Compliance state. In another, the generators start when the CMM Start bit is set, the LTSM has entered the L0 state, and an SKP Ordered Set sequence has been launched to the CMM slave. Note that in the Polling•Compliance mode, both the scrambler and de-scrambler (if provided) are disabled. In the CMM mode, however, a Scrambler Enable configuration register bit may determine if the scrambler/de-scrambler is enabled or bypassed.

Once started, each state machine P1 SM, P2 SM may generate the sequence of symbols stored in data registers CMM D3, D2, D1, and D0. Four additional configuration bits, CMM Sym3, Sym2, Sym1, and Sym0 may be provided to determine if each data register contains a data symbol or a control (non-data) symbol. Still referring to FIG. 4A, P1 SM generates the compliance pattern {CMM D0, CMM D1, CMM D2, CMM D3} on complpattern1[8:0] where bit #8 denotes the control/data information. The default symbol pattern for the P1 SM may be {K28.5, D 21.5, K28.5, D10.2} as defined under PCI Express, which can be re-programmed. The initial disparity is also programmable via a configuration register bit, but it may be defaulted to 0. As to the Pattern generator P2 SM, it may generate the inverse of the pattern generated by the P1 SM, on complpattern2[8:0] where again bit #8 denotes the control/data information.

A running compliance pattern for the default example, by the P1 SM, is shown in FIG. 4B. The start conditions, as described previously, initialize the running disparity to 0. The corresponding running compliance pattern for the P2 SM is shown in FIG. 4C. Note how the inverted lanes are just delayed with respect to the noninverted lanes, by inserting in this case two D0 (default K28.5) symbols before the compliance sequence (D0-D3). These characters will leave the running disparity back at 0, before starting into the compliance sequence. The net effect is that the adjacent lanes will be inverted from the delayed lane.

Figure 5:
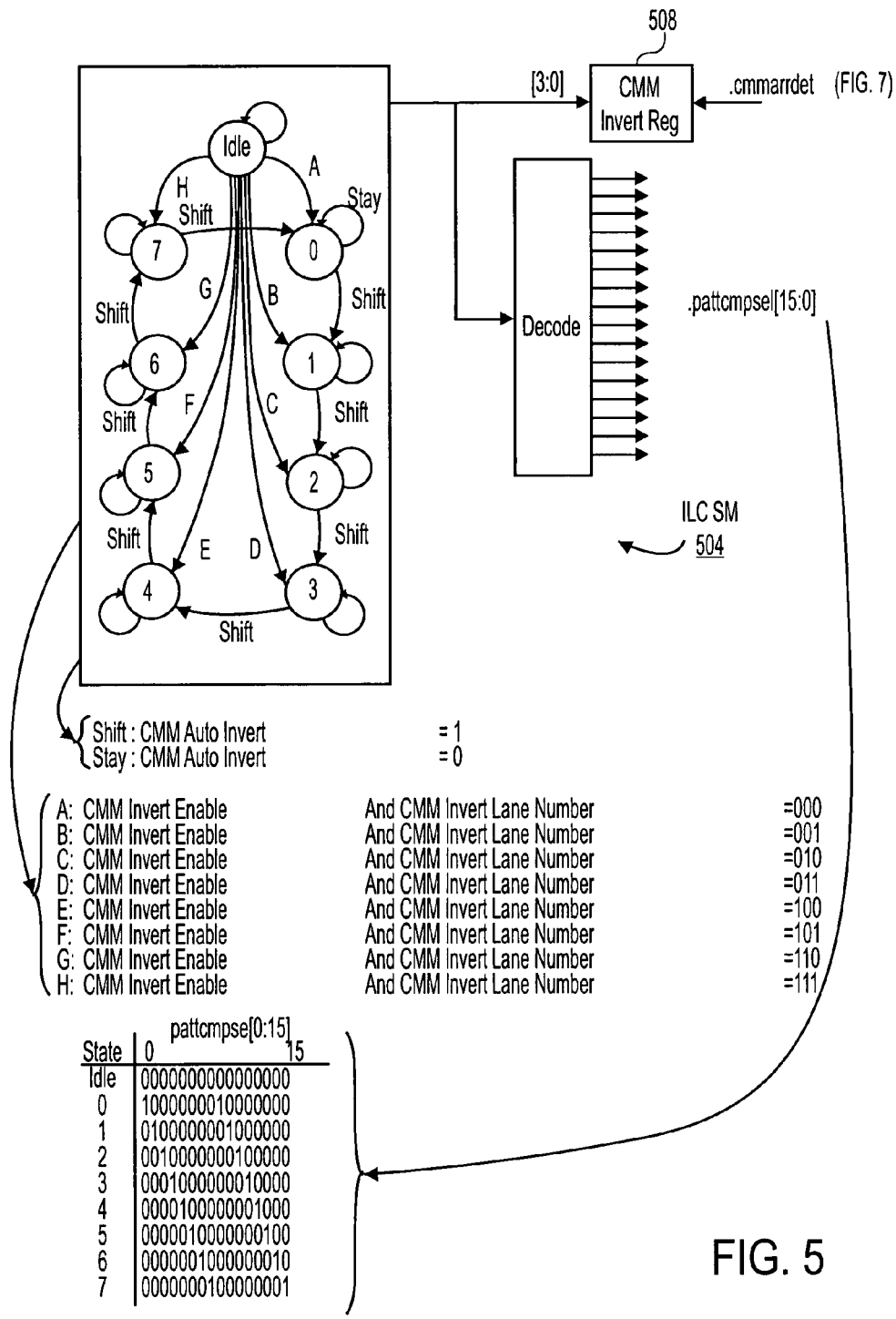
FIG. 5 shows an example state machine that may be used to control the generation of pattern selections for each lane of a serial point to point link, for operation in the measurement mode.

The Invert Lane Select (ILS) state machine (SM), ILS SM 504, shown in FIG. 5 generates pattern selects for each lane. In CMM mode, each lane may be transmitting from either the P1 SM or the P2 SM (FIG. 4A) according to the selects generated by the ILS SM 504. If CMM Invert Enable is asserted, no inversion will happen on any lanes and the P1 SM will be transmitting on all lanes. If, during evaluation of the looped back symbols, an error occurs, the state of the ILS SM 504 is stored in a CMM Invert register 508. FIG. 5 shows the ILS SM 504 having an example nine states (Idle and states 0-7) represented by a four bit output. Each state specifies a different 16-bit compliance pattern pattcmpsel[15:0]. Transitions between states are governed by conditions A-H as they are found in the programmable registers CMM Invert Enable and CMM Invert Lane Number. Other implementations of the above-described lane inversion capability in CMM mode are possible.

Example Receiver Comparison Circuitry

Figure 6:
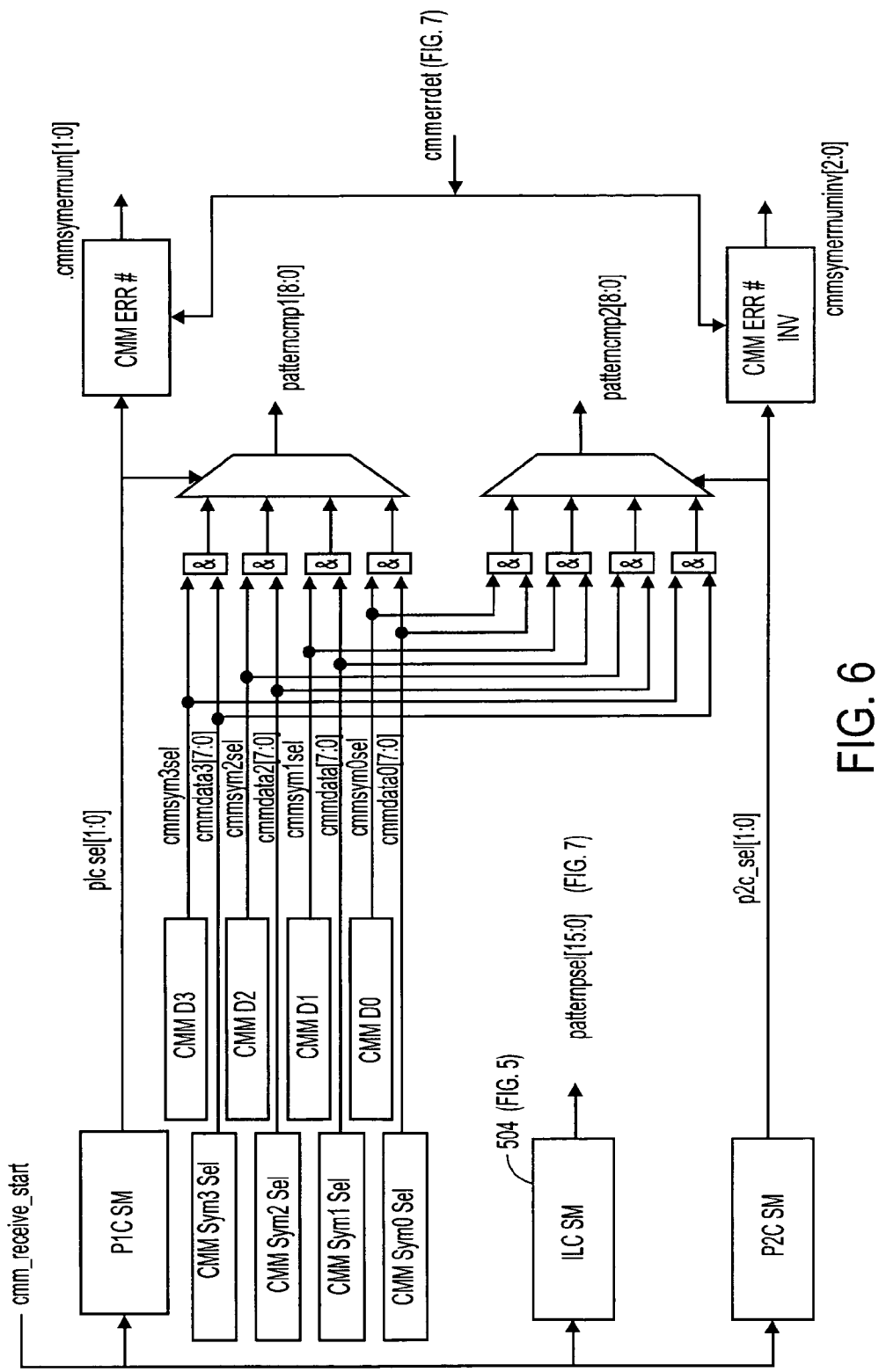
FIG. 6 illustrates a block diagram of a technique for generating comparison test symbols, to be compared to those received over the serial point to point link, in the measurement mode.

According to an embodiment of the invention, the looped back symbols may be evaluated by generating compare patterns using essentially duplicates of the transmit state machines (see FIG. 4A). These are P1C SM and P2C SM as shown in FIG. 6. One difference between the transmit and compare versions of the state machines may be the start condition. For the compare data state machines, the start condition may be: the CMM Start bit being set and the LTSM has entered the L0 state and a SKP sequence has been received (looped back). Note that in CMM mode, the SKPs may be suppressed after the launch of the first SKP sequence upon entering L0.

When a comparison error has been detected (cmmerrdet is asserted), the states of both compare state machines P1C SM and P2C SM are stored in the registers CMM Error Number (cmmsymerrnum[1:0]) and CMM Error Number Inv (cmmsymerrnuminv[2:0]), respectively, for later readout by a host in the system.

Figure 7:
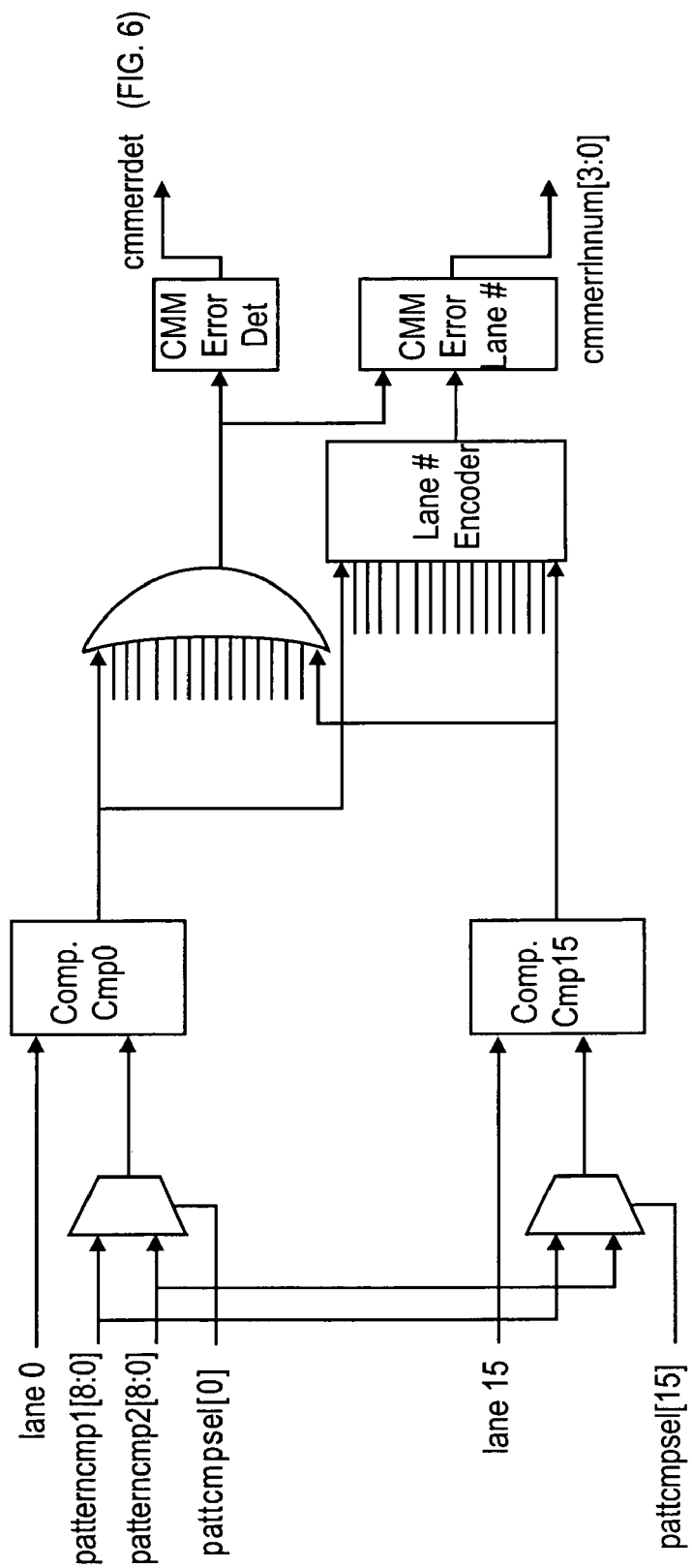
FIG. 7 illustrates a block diagram of comparison circuitry for use in the measurement mode.

By syncing on the reception of the SKP, the compare pattern generators P1C SM and P2C SM will match the incoming data on each lane. An example logic diagram of the comparison logic is shown in FIG. 7, where a per lane comparison is done on the generated compare pattern versus the received data, and the results are OR'd to produce an error bit stored in CMM Error Detect (cmmerrdet is asserted). A priority encoder will encode the highest order failing lane number and store it in CMM Error Lane Number (indicated by cmmerrlnnum[3:0]). The CMM Error Detect register bit may be polled by the host, to report that a failure has occurred. If a failure occurs, the expected data can be reconstructed from the CMM Error Lane Number, CMM Invert, CMM Error Number, and CMM Error Number Invert register bits. CMM Error Lane Number indicates the failing lane, while CMM Invert indicates if the lane was inverted or not. Based on the invert state, either the CMM Error Number or CMM Error Number Invert register indicates which data register was being compared. Other logic designs for this comparison capability are also possible.

When an error is detected as described above (cmmerrdet asserted), the CMM Error Lane Number, CMM Invert, CMM Error Number, and CMM Error Number Invert register bits may be locked. No additional errors may be logged in that case. The host should then read those bits. To reset the CMM mode thereafter, the IC device may be designed to go through a hard reset.

The above-described link interface circuitry and methodology may also be implemented in IC devices that are designed to communicate via a serial, point to point interconnect technology that provides isochronous support for multimedia. Isochronous support is a specific type of QoS (Quality of Service) guarantee that data is delivered using a deterministic and time-dependent method. Platform-based isochronous support relies on a documented system design methodology that allows an application that requires a constant or dedicated level of access to system resources to gain the required bandwidth at a given time interval.

Figure 8:
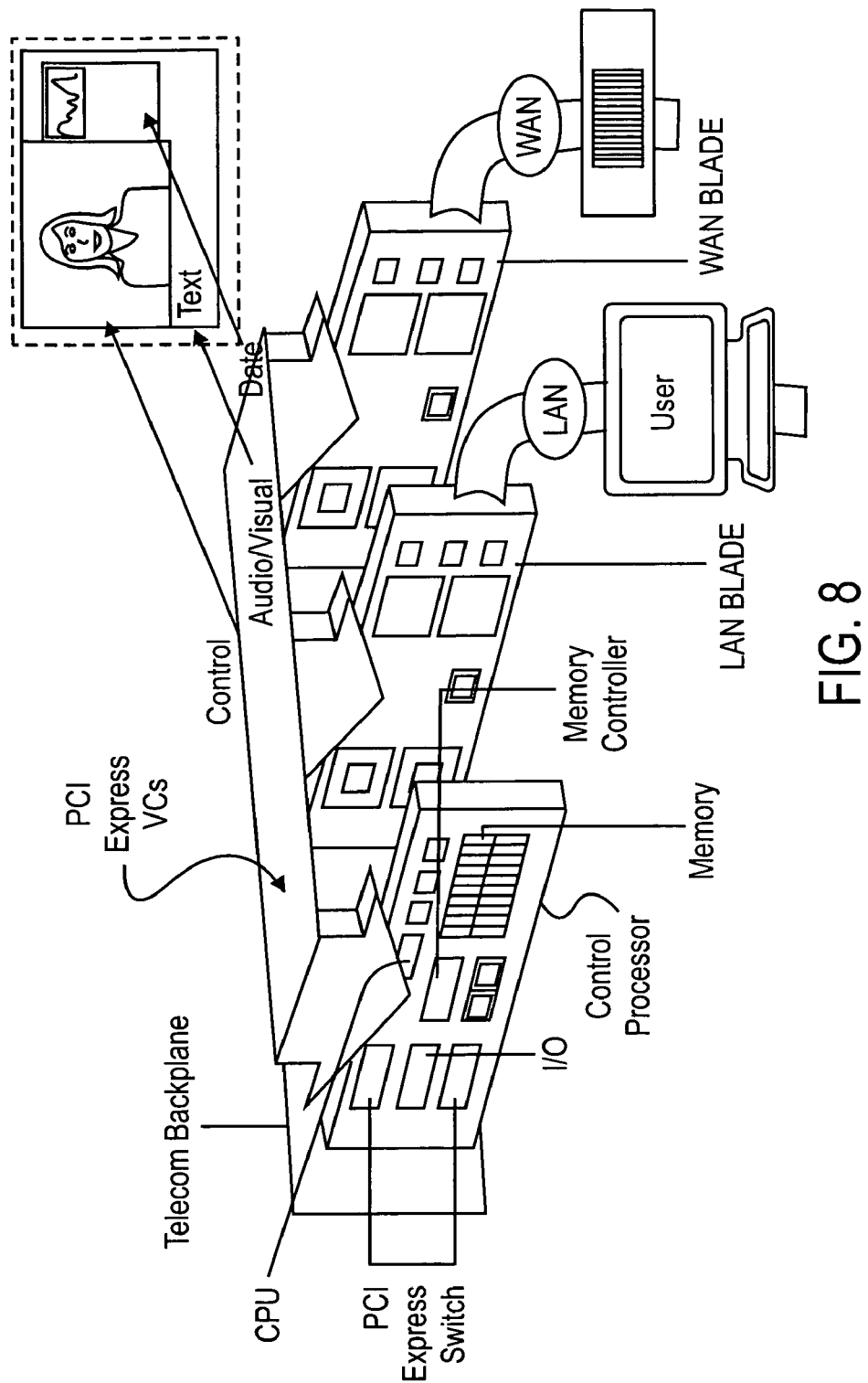
FIG. 8 identifies the various elements of a multi-media desktop personal computer some of which are communicationally coupled to each other via PCI Express virtual channels (VCs).

An example is that of watching an employee broadcast that originates from the company's CEO, on a desktop while working on a report, as shown in FIG. 8. Data is routed from the intranet into the desktop main memory where the application utilizes the data to create an audio stream sent to the user's headphones via an add-in card and a video stream sent to the display via a graphics controller. If simultaneous operations are occurring within the desktop personal computer (PC), such as disk reads, data coming off the Internet, word processing, email, and so on, there is no guarantee that the audio and video stream will be truly glitchless. Data is delivered on a "best effort" method only. The user may experience skips or stalls as applications compete for the same resources. Isochrony in PCI Express solves this problem by establishing a mechanism to guarantee that time-sensitive applications are able to secure adequate system resources. For example, in FIG. 8, the video time-sensitive data would be guaranteed adequate bandwidth to prevent skips at the expense of non-critical data such as email.

The above-described link interface circuitry and methodology may also be implemented in IC devices that are designed to communicate via a serial point to point link technology that is used in communications equipment, from embedded applications to chassis-based switching systems. In advanced switching, mechanisms are provided to send packets peer-to-peer through the switch fabric. These markets also benefit from the server class hardware-based error detection that is available with PCI Express. There may be two main types of usages within communications equipment, control plane processing and data plane processing. Control plane refers to the control and configuration of the system. The serial link may be used as the interface to configure and control processors and cards within a large number of systems. Chassis-based building switches typically have various cards that can be inserted and used. Chassis-based switches may offer field-upgradeability. Most switching systems offer the ability to only populate half of the chassis initially and add cards with additional ports or faster speed connections as demand or the number of users increase. The serial link technology could be used as a control plane interconnect to configure and monitor the different types of cards installed within the system. The enumeration and established configuration protocol within PCI Express, for example, lends itself to a low pin count, high bandwidth interface to configure cards and services.

The data plane refers to the actual path that the data flows. In the data plane, an advanced switching extension may define mechanisms to encapsulate and send PCI Express data packets across peer-to-peer links through the switch fabric.

The PCI Express core architecture may provide a solid foundation for meeting new interconnect needs. The Advanced Switching (AS) architecture overlays on this core and establishes an efficient, scalable, and extensible switch fabric through the use of a specific AS header inserted in front of the PCI Express data packet at the Transaction Layer. AS switches only examine the contents of the header that provide routing information (where to send the packet), traffic class ID (quality of service information), congestion avoidance (for preventing traffic jams), packet size, and protocol encapsulation. By separating the routing information, switch designs are simpler and cost-effective. Additionally, adding an external header to the packet enables the switch fabric to encapsulate any number of existing protocols.

Figure 9:
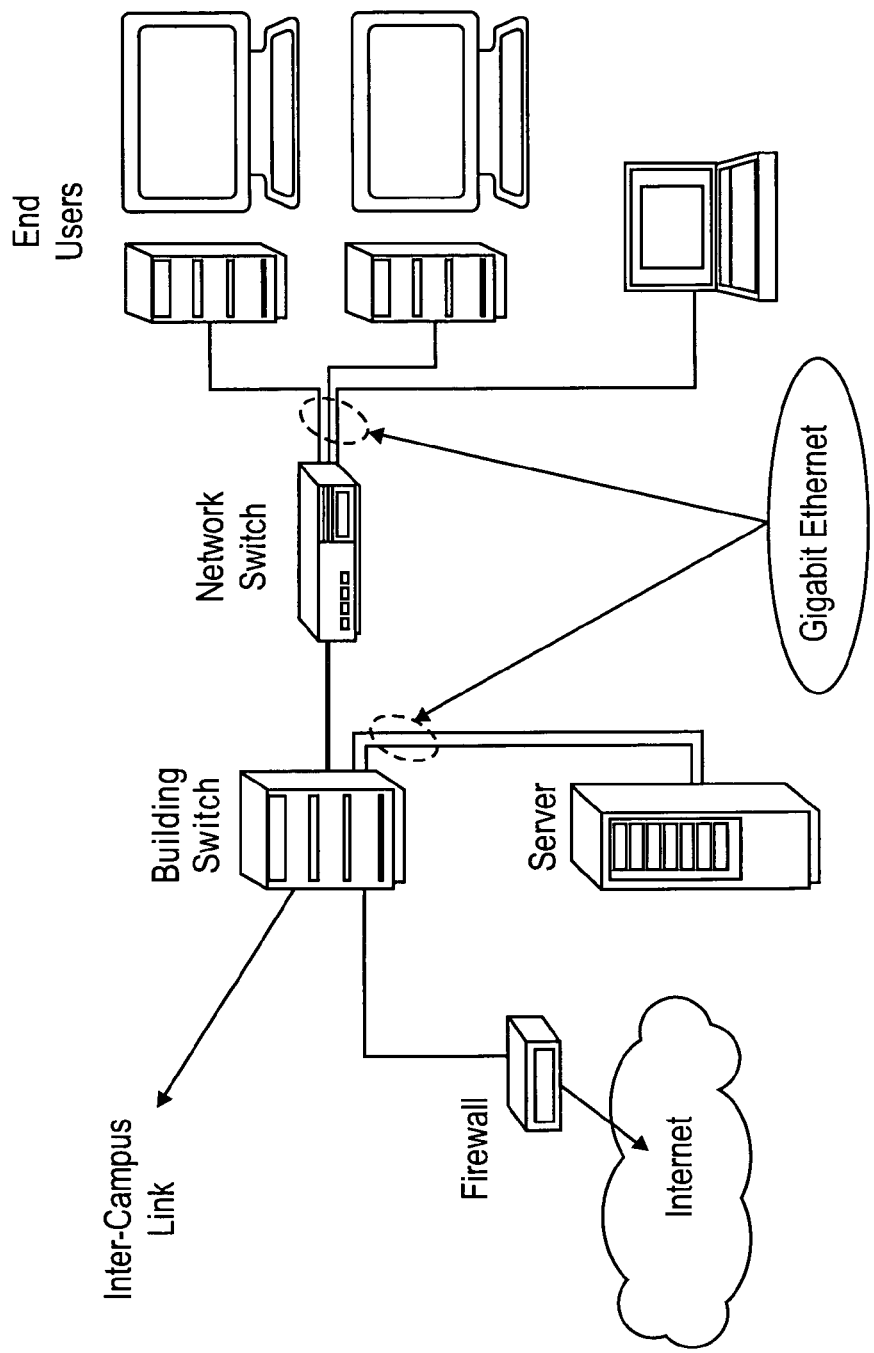
FIG. 9 depicts a block diagram of an enterprise network.

The above-described link interface circuitry and methodology may also be implemented in IC devices that are designed to communicate via a serial point to point interconnect technology that is used for network connections (in place of Gigabit Ethernet, for example). The network connection may be for corporate mobile and desktop computers for sharing files, sending emails, and browsing the Internet. Servers as well as communications equipment may be expected to implement such network connections. An example of such a network connection within the enterprise network is shown in FIG. 9.

Although the above examples may describe embodiments of the invention in the context of combinational and sequential logic circuits, other embodiments of the invention can be implemented by way of software. For example, some embodiments, may be provided as a computer program product or software which may include a machine or computer-readable medium having stored thereon instructions which may be used to program a computer (or other electronic devices) to perform a process according to an embodiment of the invention. In other embodiments, operations might be performed by specific hardware components that contain microcode, hardwired logic, or by any combination of programmed computer components and custom hardware components.

Further, a design may go through various stages, from creation to simulation to fabrication. Data representing a design may represent the design in a number of manners. First, as is useful in simulations, the hardware may be represented using a hardware description language or another functional description language. Additionally, a circuit level model with logic and/or transistor gates may be produced at some stages of the design process. Furthermore, most designs, at some stage, reach a level of data representing the physical placement of various devices in the hardware model. In the case where conventional semiconductor fabrication techniques are used, data representing a hardware model may be the data specifying the presence or absence of various features on different mask layers for masks used to produce the integrated circuit. In any representation of the design, the data may be stored in any form of a machine-readable medium. An optical or electrical wave modulated or otherwise generated to transmit such information, a memory, or a magnetic or optical storage such as a disc may be the machine readable medium. Any of these mediums may "carry" or "indicate" the design or software information. When an electrical carrier wave indicating or carrying the code or design is transmitted, to the extent that copying, buffering, or re-transmission of the electrical signal is performed, a new copy is made. Thus, a communication provider or a network provider may make copies of an article (a carrier wave) that features an embodiment of the invention.

To summarize, various embodiments of a compliance measurement/margining (CMM) mode for testing a serial point to point link have been described. In the foregoing specification, the invention has been described with reference to specific embodiments thereof. It will, however, be evident that various modifications and changes may be made thereto without departing from the broader spirit and scope of the embodiments of the invention as set forth in the appended claims. For example, although a system embodiment has been described using the serial point to point link as a chip to chip connection between two devices on a printed wiring board such as in a desktop, server, or notebook computer, the CMM technique may also be used with serial point to point links that are part of an external bus for connecting the computer to a peripheral such as a keyboard, monitor, external mass storage device, or camera. The point to point link may be used in not only computer systems, but also dedicated communications products such as mobile phone units, telecommunication switches, and data network routers. The specification and drawings are, accordingly, to be regarded in an illustrative rather than a restrictive sense.

What is claimed is:

1. A method comprising:
    initializing a serial point to point link that communicatively couples an integrated circuit (IC) device to another IC device, by transferring a training sequence of symbols over the link;
    programming a plurality of registers of the IC device to i) set a test symbol data pattern and ii) configure a lane transmitter for the link;
    programming a start bit in a register of the IC device, to request that the IC device be placed in a measurement mode; and
    the IC device, in said measurement mode, instructs said another IC device to enter a loopback mode for the link in which symbols received over the link are looped back, transmits a sequence of test symbols over the link and evaluates a looped back version of the sequence for errors, wherein the sequence of test symbols have a data pattern, and are transmitted, as configured in the plurality of registers.

2. The method of claim 1 wherein the initializing further comprises determining how many lanes are available for operation in said link.

3. The method of claim 2 wherein the IC device indicates that the link is ready for normal operation with a determined number of lanes, and wherein the programming of the start bit is performed by a host while the link is ready for normal operation.

4. The method of claim 1 wherein the IC device, prior to entering the measurement mode for the link, makes the following PCI Express state transitions: L0 to Recovery to L0 to Polling Compliance.

5. The method of claim 1 wherein the IC device, upon exiting the measurement mode for the link, makes the following PCI Express state transitions:
    Polling Compliance to Loopback Exit to Detect Quiet.

6. The method of claim 1 further comprising:
programming by a host a stop bit in a register of the IC device, to request that the link exits the measurement mode.

7. The method of claim 6 wherein the programming of the start and stop bits include invoking PCI Express configuration write commands.

8. The method of claim 1 wherein the IC device, in the measurement mode, instructs said another IC device to enter the loopback mode by transmitting a PCI Express TS1/TS2 Ordered Set over the link.

9. An integrated circuit (IC) device, comprising:
an analog front end (AFE) transmit block coupled to a serial point to point link;
an AFE receive block coupled to the serial point to point link; and
measurement mode circuitry (MMC) to provide the AFE transmit block a sequence of test symbols to be transmitted over the link while the link is operating in a measurement mode, the MMC to evaluate a sequence of test symbols, received by the AFE receive block over said link, for errors,
wherein the IC device is to enter the measurement mode from a normal mode in response to a predefined bit of a register of the IC device being programmed, the IC device having one or more programmable registers whose bits instruct the MMC to change a data pattern in the sequence of test symbols and one of a) an autoinvert setting, b) a default setting for an inverted lane of the link, c) an inversion setting, and d) initial disparity, for the link.

10. The IC device of claim 9 wherein the MMC is to log an error in the received sequence of test symbols in a software-accessible register of the IC device.

11. The IC device of claim 9 wherein upon the IC device entering the measurement mode, the MMC is to instruct another IC device at another end of the link to loop the transmitted sequence of test symbols back over the link.

12. The IC device of claim 11 wherein the MMC is to provide a training sequence of symbols that is to be transmitted by the AFE transmit block upon the link entering the measurement mode and that is recognizable by said another IC device as including a request to place said another end of the link in a loopback mode.

13. The IC device of claim 11 wherein the MMC is to provide a PCI Express TS1/TS2 Ordered Set that is to be transmitted by the AFE transmit block upon the link entering the measurement mode and that includes a loopback bit being set.

14. The IC device of claim 9 wherein the sequence of test symbols includes a PCI Express SKP Ordered Set followed by a compliance pattern.

15. The IC device of claim 9 wherein the IC device is to remain in the measurement mode and is not to exit the measurement mode until a predefined bit of a register of the IC device has been programmed.

16. The IC device of claim 9 wherein the bit of the register is software-accessible during the normal mode via a configuration write command.

17. A system comprising:
a processor;
a main memory; and
an integrated circuit (IC) device which is communicatively coupled to the processor and the main memory and provides the processor with I/O access, the IC device having link interface circuitry that supports a serial point to point link, the link interface circuitry includes
an analog front end (AFE) transmit block coupled to the link;
an AFE receive block coupled to the link; and
measurement mode circuitry (MMC) to provide the AFE transmit block a sequence of test symbols to be transmitted over the link while the link is operating in a measurement mode, the MMC to evaluate a sequence of test symbols, received by the AFE receive block over said link, for errors,
wherein the IC device is to enter the measurement mode from a normal mode in response to a predefined bit of a register of the IC device being programmed, the IC device having one or more programmable registers whose bits instruct the MMC to change a data pattern in the sequence of test symbols and one of a) an autoinvert setting, b) a default setting for an inverted lane of the link, c) an inversion setting, and d) initial disparity, for the link.

18. The system of claim 17 wherein upon the IC device entering the measurement mode, the MMC is to instruct another IC device at another end of the link to loop the transmitted sequence of test symbols back over the link.

19. The system of claim 18 wherein the MMC is to provide a training sequence of symbols that is to be transmitted by the AFE transmit block upon the link entering the measurement mode and that is recognizable by said another IC device as including a request to place said another end of the link in a loopback mode.

20. The system of claim 17 wherein the IC device is to remain in the measurement mode and is not to exit the measurement mode until the predefined bit of a register of the IC device has been programmed.

21. The system of claim 17 wherein the predefined bit of the register is software-accessible during the normal mode via a processor-initiated configuration write command.

22. The system of claim 18 wherein the IC device is a memory controller hub.

23. The system of claim 19 wherein the IC device is an I/O controller hub that communicatively couples the processor to peripheral devices.

* * * * *